United States Patent [19]

Takahashi et al.

[11] 3,814,997

[45] June 4, 1974

[54] SEMICONDUCTOR DEVICE SUITABLE FOR IMPATT DIODES OR VARACTOR DIODES

[75] Inventors: Susumu Takahashi, Kokubunji; Hitoshi Sato, Tokyo; Yoichi Kaneko, Tokorozawa; Masatoshi Migitaka, Kokubunji; Shinya Iida, Tama, all of Japan

[73] Assignee: Hitachi Ltd., Tokyo, Japan

[22] Filed: June 6, 1973

[21] Appl. No.: 367,366

Related U.S. Application Data

[63] Continuation-in-part of Ser. No. 152,355, June 11, 1971, abandoned.

[30] Foreign Application Priority Data

June 15, 1970 Japan ........................... 45-51024
July 17, 1970 Japan ........................... 45-62057

[52] U.S. Cl. ........................ 357/58, 357/89, 357/63
[51] Int. Cl. ........................ H01l 11/00, H01l 15/00
[58] Field of Search ........... 317/235, 47.1, 48.1, 43, 317/40.1

[56] References Cited

UNITED STATES PATENTS

| | | | |
|---|---|---|---|
| 3,244,950 | 4/1966 | Ferguson | 317/235 |
| 3,312,881 | 4/1967 | Yu | 317/235 |
| 3,649,386 | 3/1972 | Murphy | 317/235 AK |

*Primary Examiner*—Andrew J. James
*Attorney, Agent, or Firm*—Craig & Antonelli

[57] ABSTRACT

A semiconductor device suitable for IMPATT diodes or varactor diodes which are used in the microwave of millimeter wave band in which an $n$ type GaAs body whose impurity concentration is about $8 \times 10^{16}$ cm$^{-3}$ having a small cross-sectional area surrounded by an intrinsic or $n^-$ type GaAs layer is disposed on an $n^+$ type GaAs substrate region. A $p^+$ type region having a lateral extension far greater than that of the $n$ type GaAs body is disposed over the $n$ type GaAs body to form a small entirely flat area $p$–$n$ junction therebetween. Ohmic electrodes are disposed on the $p^+$ type region and the $n^+$ type GaAs substrate. This structure provides a high breakdown voltage, a low junction resistance and a small junction capacitance, and facilitates the leading out of the electrode.

10 Claims, 3 Drawing Figures

SEMICONDUCTOR DEVICE SUITABLE FOR IMPATT DIODES OR VARACTOR DIODES

CROSS-REFERENCE TO RELATED APPLICATION

This application is a continuation-in-part application of U.S. Pat. application Ser. No. 152,355 filed on June 11, 1971 and now abandoned.

BACKGROUND OF THE INVENTION

1. Field of the Invention

The present invention relates to semiconductor devices, in particular IMPATT diodes, varactor diodes and the like for use in the microwave or millimeter wave band, which have a high breakdown voltage, a low junction resistance and a small junction capacity, and the electrodes of which can easily be led out.

2. Description of the Prior Art

Heretofore, a method of selective diffusion has most commonly been utilized to provide a semiconductor body with a *p-n* junction. However, this method has the following disadvantages:

1. In order to make the electrostatic capacitance of a *p-n* junction small, the area of the junction must be made small. However, it is difficult to make a junction flat, even at its peripheral portion when the junction is small for example, when the diameter of the junction is smaller than about 10 microns.

2. Since the size of the electrode portion is limited by the size of the junction, it is very difficult for a lead wire to be attached to the electrode when the junction is small. This is because the usually employed thermocompression bonding or ultrasonic bonding technique is not easily applied to an electrode area of less than about 10 microns in diameter. In order to overcome this difficulty there has been proposed the so-called honeycomb method in which a thin metal wire is pressure contacted to the electrode part. However, this contact is mechanically weak and has insufficient reliability.

3. When selective diffusion is carried out, the diffusion occurs in parallel directions as well as in a direction perpendicular to the surface of a substrate. Consequently, the diffused region extends wider than the opening formed in an insulating film and, as a result, the junction between the diffused region and the substrate is curved at its periphery. The curvature of the junction reduces the breakdown voltage of the junction. Although the phenomenon of the extension of the diffused region wider than the opening of the diffusion mask is a generally occurring phenomenon, the phenomenon is particularly pronounced in gallium arsenide.

Since the disadvantage (3) is particularly pronounced in gallium arsenide, the description of the embodiments of the present invention will be made with respect to gallium arsenide by way of example. However, it is to be noted that the present invention is, of course, also applicable to other semiconductor materials.

There has also been manufactured a mesa-type *p-n* junction semiconductor device having a junction crosssection smaller than the area of the electrode. This process is generally employed fo fabricating IMPATT diodes and varactor diodes. In the process of manufacturing such a semiconductor device mesa-etching is performed after the attachment of a lead wire to the electrode. In these semiconductor devices, such as IMPATT diodes and varactor diodes fabricated according to the above-mentioned steps, the edge of the junction is exposed to an ambient atmosphere. Consequently, such semiconductor devices have the disadvantage that the characteristics thereof deteriorate rapidly.

There is another method of leading out an electrode in which a metal for an electrode is overlaid on an oxide film. Although this kind of structure makes a firmer contact between the electrode and the lead wire than the honeycomb structure and hence is stronger under mechanical vibrations, it has the disadvantages that the mechanical strength is limited by the strength of the bonding between the metal and the oxide film, and the parasitic capacitance through the oxide film is larger due to the thinness of the oxide film, of generally less than 1 micron, which impairs the characteristics of the device.

SUMMARY OF THE INVENTION

An object of the present invention is to provide a semiconductor device suitable for IMPATT diodes or varactor diodes which has a breakdown voltage higher than that of a semiconductor device manufactured by the conventional selective diffusion methods, which deteriorates more slowly than a mesa type semiconductor device in which the edge of the *p-n* junction is exposed, and which is mechanically stronger than the honeycomb structure of a device in which a thin metal wire is press contacted to the electrode.

According to the present invention, there is provided a semiconductor device suitable for IMPATT diodes or varactor diodes comprising a semiconductor substrate having a first conductivity type, a semiconductor layer on the substrate having a higher resistivity than that of the substrate, a semiconductor body disposed through the semiconductor layer to contact the semiconductor substrate, the semiconductor body, having the first conductivity type, whose impurity concentration is from about $1 \times 10^{16}$ cm$^{-3}$ to about $1 \times 10^{17}$ cm$^{-3}$, which is of a higher resistivity than that of the semiconductor substrate but lower than that of the semiconductor layer. A semiconductor region is disposed in the semiconductor layer over the semiconductor body and laterally extends beyond the semiconductor body. The semiconductor region has a second conductivity type to form a *p-n* junction with the semiconductor body, an ohmic electrode is provided on the semiconductor region, and another ohmic electrode is disposed on the other side of the semiconductor substrate.

According to one feature of the above structure, the semiconductor region to which an ohmic electrode is provided is large in its lateral extension. Consequently, a large area electrode can be provided to facilitate the attachment of a lead wire thereto.

According to another feature of the above structure, the *p-n* junction is flat and has no curved portion at which the concentration of an electric field occurs. Thus, a predetermined breakdown voltage is provided. Furthermore, since the size of the p-n junction which mainly determines the electrostatic capacitance can be reduced independently of the semiconductor region to which an electrode is provided, the electrostatic capacitance can be reduced. Moreover, since the *p-n* junction is embedded in the semiconductor layer and the edge thereof is not exposed, the device is subject to only a slight amount of deterioration.

DESCRIPTION OF THE PREFERRED EMBODIMENTS

EXAMPLE 1

Figure 1:
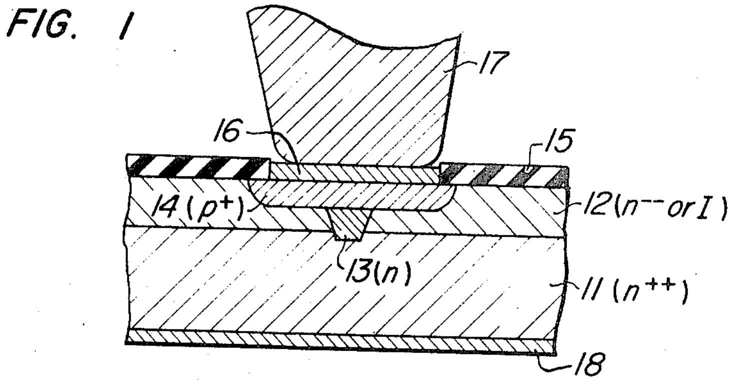
FIG. 1 is a cross-sectional view of an embodiment of the semiconductor device according to the present invention.

Referring now to FIG. 1 which shows an embodiment of the present invention, on an $n^{++}$ type semiconductor substrate 11 having a high impurity concentration there is epitaxially grown an $n^{--}$ type or I type semiconductor layer 12. An $n$-type semiconductor body 13 having a small cross-sectional area and extending to the substrate 11 is formed by the conventional diffusion method through the semiconductor layer 12. A $p^+$ type semiconductor region 14 is formed by the conventional diffusion method in the semiconductor layer 12 and over the $n$-type semiconductor body 13 laterally extending much beyond then $n$-type semiconductor body 13. The semiconductor body 13 and the semiconductor region 14 form a $p$-$n$ junction therebetween. In an opening in an oxide passivation film 15 which is formed on the surface of the semiconductor layer 12 there is provided an ohmic electrode 16 to the $p^+$ type semiconductor region 14 to which a lead wire 17 is attached. Another ohmic electrode 18 is provided on the opposite surface of the semiconductor substrate 11.

Figure 2:
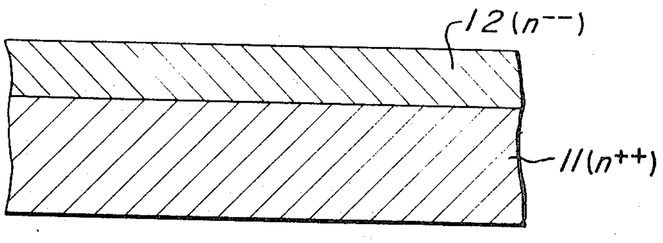
FIGS. 2 to 5 are diagrams schematically illustrating the process of manufacturing the embodiment of FIG. 1.

A method of manufacturing the semiconductor device of FIG. 1 will next be described, with reference to FIGS. 2 to 5. On an $n^{++}$ type gallium arsenide substrate 11 having a high impurity concentration of $2 \times 10^{18}$ $cm^{-3}$ an $n^{--}$ type semiconductor layer 12 having a low impurity concentration of from $1 \times 10^{15}$ to $8 \times 10^{14}$ $cm^{-3}$ is epitaxially grown from vapor phase to a thickness of 4 microns, as shown in FIG. 2. It is desirable for the impurity concentration of the $n^{--}$ type layer 12 to be as low as possible. The above value of $1 \times 10^{15}$ to $8 \times 10^{14}$ $cm^{-3}$ as the impurity concentration is the lowest value attainable by the present level of technique.

Figure 3:
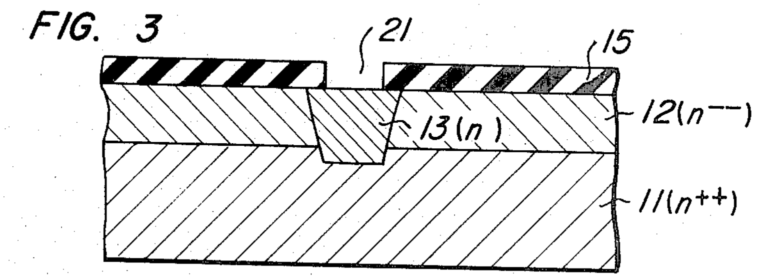

Then, an oxide film 15 such as a phosphosilicate glass film is deposited by a chemical vapor deposition method on the epitaxially grown semiconductor layer 12 to a thickness of about 5,000 angstroms. An opening 21 having a diameter of 5 to 10 microns is formed in the oxide film 15 by a photoetching technique. Next, on the exposed surface of the epitaxially grown semiconductor layer 12 in the opening 21 a gallium sulphide film is deposited on which a silicon oxide film is further deposited, and, thereafter, a diffusion process is carried out at a temperature of 800° C for 6 hours to form an $n$-type semiconductor body 13 having an impurity concentration of from $1 \times 10^{17}$ to $8 \times 10^{16}$ $cm^{-3}$, at which time the $n$-type semiconductor body 13 extends to the $n^{++}$ type semiconductor substrate 11. Then the gallium sulphide and silicon oxide films are removed as shown in FIG. 3.

Figure 4:
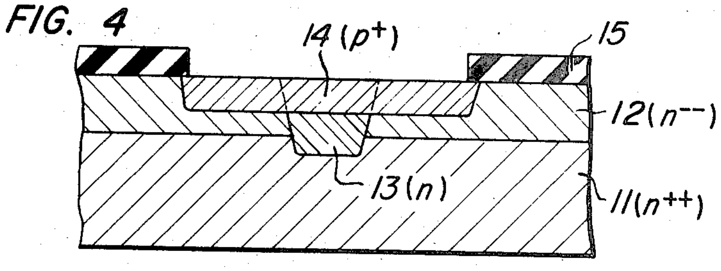

Next, an opening of 30 microns in diameter is formed in the oxide film 15 in registered relationship with the $n$-type semiconductor body 13 by a photoetching technique. The structure is then placed in a quartz ampoule, together with polycrystalline gallium arsenide or arsenic and zinc, and a diffusion process for diffusing zinc into the epitaxially grown semiconductor layer 12 and the $n$-type semiconductor body 13 through the latter opening is performed to form a $p^+$ type semiconductor region 14 to a concentration of $2 \times 10^{20}$ to $8 \times 10^{19}$ $cm^{-3}$ and to a depth of 2 to 2.5 microns, as shown in FIG. 4.

The diffusion of zinc may be made in the open state without utilizing the ampoule.

The $n^{--}$ type epitaxially grown semiconductor layer 12 on the $n^{++}$ type semiconductor substrate 11 is not necessarily deposited from vapor phase. A semiconductor layer having an impurity concentration of about $1 \times 10^{15}$ $cm^{-3}$ can be epitaxially grown also from the liquid phase. The $n^{--}$ type semiconductor layer 12 can be replaced by an I type semiconductor layer doped with chromium.

Figure 5:
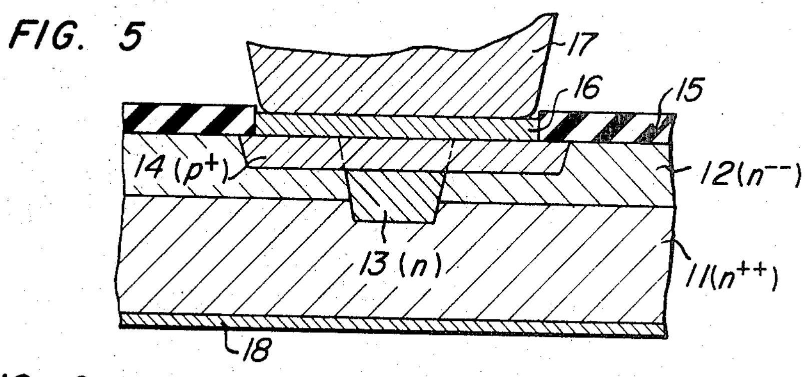

The device is completed by providing ohmic electrodes 16 and 18 to the $p^+$ type semiconductor region 14 and the $n^{++}$ type substrate 11 as shown in FIG. 5 and by being encapsulated in a casing. At the time of encapsulation a lead conductor 17 is attached to the electrode 16 by thermo-compression bonding.

EXAMPLE 2

Figure 6:
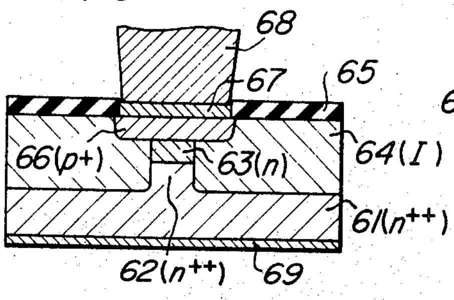
FIG. 6 is a cross-sectional view of another embodiment of the semiconductor device according to the present invention.

Referring to FIG. 6 which shows another embodiment of the present invention, an $n$-type gallium arsenide semiconductor body 63 is provided on the top surface of a small area plateau 62 of an $n^{++}$ type gallium arsenide substrate 61 having a high impurity concentration. The impurity concentration of the $n$-type semiconductor body 63 is lower than that of the substrate 61. An I type gallium arsenide layer 64 is provided on the $n^{++}$ type substrate 61 except on the plateau 62 and on the $n$-type semiconductor body 63 to a depth at least equal to the total height of the plateau 62 and the $n$-type semiconductor body 63. The top surface of the I type layer 64 is convered with a passivating insulator film 65 such as a phosphosilicate glass film which also functions as a diffusion mask. In the I type layer 64 a $p^+$ type semiconductor region 66 extending laterally beyond the $n$-type semiconductor body 63 is formed over the $n$-type semiconductor body 63. An ohmic electrode 67 is provided to the semiconductor region 66 through an opening formed in the insulator film 65. Another ohmic electrode 69 is provided to the opposite surface of the $n^{++}$ type substrate. The electrode 67 is provided with a lead conductor 68.

According to this structure, the parasitic capacitance can be made smaller than that of the device of Example 1 by making the height of the plateau 62, and hence the thickness, of the intrinsic layer 64 large.

A process of manufacturing the device of FIG. 6 will next be described with reference to FIGS. 7 to 12.

Figure 7:
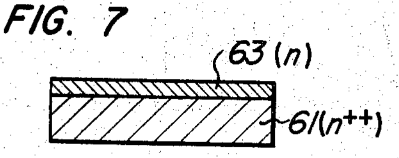
FIGS. 7 to 12 are schematic diagrams illustrating the process of manufacturing the embodiment of FIG. 6.

An n-type gallium aresnide semiconductor body 63 having an impurity concentration of $8 \times 10^{16}$ $cm^{-3}$ is grown to a thickness of 4 microns on an $n^{++}$ type gallium arsenide substrate 61 having an impurity concentration of $3 \times 10^{18}$ $cm^{-3}$ from vapor phase, as shown in FIG. 7.

Figure 8:
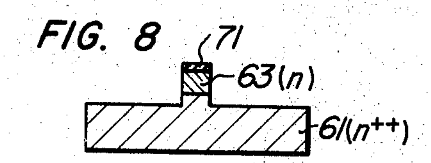

A silicon oxide film 71 is deposited on the surface of the $n$-type semiconductor body 63 to a thickness of about 2,000 angstroms by thermal oxidation of silane, and then the silicon oxide film is removed except at least one square having a dimension of $10\mu \times 10\mu$ or less. The $n$-type semiconductor body 63 and the $n^{++}$ type substrate 61 are etched to a total depth of about 5 to 6 microns by an etchant for gallium arsenide by utilizing the square silicon oxide film as an etching mask as shown in FIG. 8. If a plurality of islands as shown in FIG. 8 are to be foremd, it is desirable to make the intervals between the islands sufficiently large. In this example, the interval was made to be 150 microns. If the surface of the substrate 61 is parallel to the (100) crystallographic plane, the side wall of the island easily becomes perpendicular to the etched surface of the substrate 61.

Figure 9:
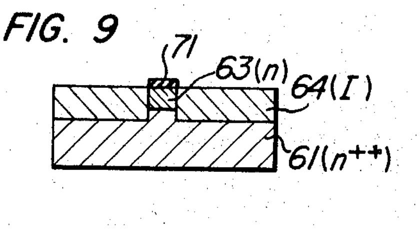

Then, a high resistivity I type layer 64 is grown on the etched surface of the substrate 61 to a level equal to the upper surface of the $n$-type semiconductor body 63 while being doped with chromyl chloride ($Cr_2O_2Cl_2$), as shown in FIG. 9.

Figure 10:
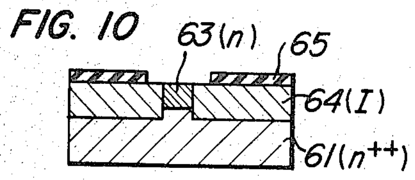

Next, the square silicon oxide film 71 is removed and then a phosphosilicate glass film 65 is deposited on the surface of the structure to a thickness of 5,000 angstroms by a vapor chemical reaction, after which an opening having a dimension of $30\mu \times 30\mu$ is formed in the phosphosilicate glass film 65 in registered relationship with the $n$-type semiconductor body 63, as shown in FIG. 10.

Figure 11:
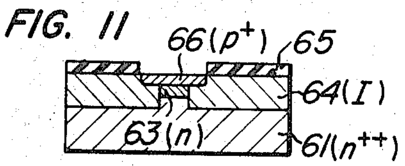

A $p^+$ type semiconductor region 66 having a thickness of about 2.5 microns is formed as shown in FIG. 11 by diffusing a $p$-type impurity such as zinc or cadmium into the structure through the opening in the phosphosilicate glass film 65 in the quartz ampoule. Then, ohmic electrodes 67 and 69 are provided to the $p^+$ type semiconductor region 66 and the $n^{++}$ type substrate 61, respectively.

Figure 12:
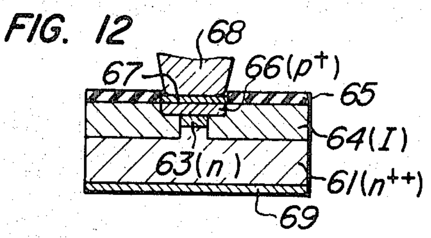

Finally, a pellet of the device is encapsulated in a prong type casing. At this time a gold wire 68 of 15 microns in diameter is attached to the ohmic electrode 67 as shown in FIG. 12 by a nailhead bonding method.

EXAMPLE 3

Figure 13:
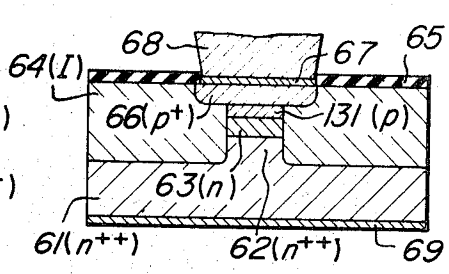
FIG. 13 is a further embodiment of the semiconductor device according to the present invention.

The semiconductor device shown in FIG. 13 can be provided by diffusing a $p$-type impurity into the $n$-type semiconductor body 63 from the upper surface thereof in Example 2 to form a $p$-type semiconductor body 131 which forms a $p$-n junction with the $n$-type semiconductor body 63, so as to form a double drift-region by way of $p^+$ semiconductor region 66, $p$ body 131, $n$ body 63, and $n^{++}$ substrate 61.

Though the $p$ type semiconductor body 131 is formed by diffusion, it may be formed by the conventional epitaxial growth method. When the $p$ type semiconductor body 131 is formed by the epitaxial growth method, the impurity concentration in the $p$ type semiconductor body 131 is controlled so as to be equal to or higher than that of the $n$ type semiconductor body 63.

According to this structure, important advantages for IMPATT diodes in addition to the advantages of the structure shown in FIGS. 1 and 6 are obtained. That is, greater output power and efficiency than these of FIGS. 1 and 6 can be obtained.

Following data were obtained in comparison with the structures of FIGS. 1, 6 and 13.

At the Oscillation Frequency of 30 $GH_z$

| | FIGS. 1,6 | FIG. 13 |
|---|---|---|
| Efficiency (%) | 20.3 | 20.5 |
| Output power KW/$cm^2$ | 6.92 | 11.6 |

At the Oscillation Frequency of 50 $GH_z$

| | FIGS. 1, 6 | FIG. 13 |
|---|---|---|
| Efficiency (%) | 18.9 | 19.1 |
| Output power KW/$cm^2$ | 4.5 | 6.5 |

At the Oscillation Frequency of 100 $GH_z$

| | FIGS. 1, 6 | FIG. 13 |
|---|---|---|
| Efficiency (%) | 15.5 | 15.8 |
| Output power KW/$cm^2$ | 2.3 | 2.9 |

Though in the above-mentioned embodiments, the semiconductor body and the semiconductor region are disposed in the $n^{--}$ type or I type semiconductor layer, they need not be disposed in the semiconductor layer. However, an $n^{--}$ type or I type semiconductor layer 64 must cover the $p$-$n$ junction exposed on the surface of the semiconductor body, which is formed between the $n$ type semiconductor body and the $p$ type semiconductor body, and the $n$ type semiconductor body and the semiconductor region, as shown in FIG. 14.

Figure 14:
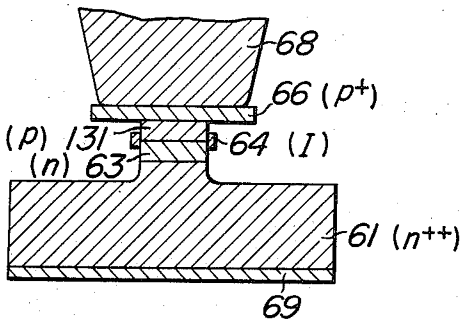
FIGS. 14 and 15 are still further embodiments of the present invention.

In FIG. 14, the same parts shown in FIG. 13 are depicted by the same numerals as those in FIG. 13.

Figure 15:
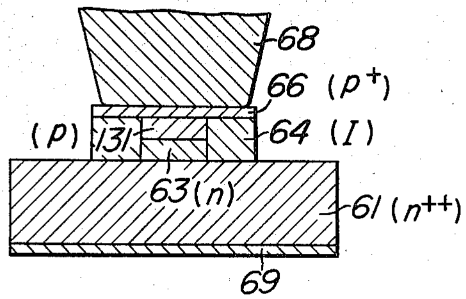

Though, in the embodiments shown in FIGS. 13 and 14, semiconductor bodies 63 and 131 are disposed on the plateau of the semiconductor substrate 61, these semiconductor bodies 63 and 131 may be disposed on a semiconductor substrate whose surface is substantially flat, as shown in FIG. 15.

In FIG. 15, the same elements as FIG. 14 are shown by the same numerals.

Concrete dimensions of the embodiments shown in FIGS. 14 and 15 are as follows:

A semiconductor substrate 61 is of $n^+$ type Si having an impurity concentration of $1 \times 10^{20}$ $cm^{-3}$ and a thickness of about 25 microns, and having a plateau of 2 microns in thickness and of 10 microns in diameter; a semiconductor body 63 disposed on the plateau is of $n$ type Si having an impurity concentration of $1 \times 10^{16}$ $cm^{-3}$ and a thickness of about 2 microns; a semiconductor body 131 is of $p$ type having the same dimension as $n$ type Si body 63; a semiconductor region 66 is of $p^+$ type Si having an impurity concentration of $8 \times 10^{19}$ $cm^{-3}$, a thickness of 3.5 microns and a diameter of 30 microns, and a semiconductor layer of $n^{--}$ type Si having an impurity concentration of $1 \times 10^{15}$ $cm^{-3}$.

The present invention has such advantages, in addition to the advantages as described above, that the semiconductor device has stable electrical characteristics for a long period of time, that is 100 time that in which a $p$-$n$ junction is exposed to air, and has a higher output power and efficiency than these of a semiconductor device having a $p$-$n$ junction exposed to air, as the semiconductor layer is a considerably better heat sink than air.

Further, in the above mentioned embodiments, though GaAs and Si are utilized as a semiconductor material, other semiconductor materials such as Ge can be utilized.

While the present invention has been explained in detail, it is to be understood that the technical scope of the invention is not limited to that of the foregoing embodiments but applicable to all semiconductor devices for IMPATT diodes and varactor diodes as stated in the claims.

We claim:

1. A semiconductor device suitable for IMPATT diodes or varactor diodes comprising:

a semiconductor substrate having a first conductivity type;

a first semiconductor body, whose impurity concentration is lower than that of said semiconductor substrate, having said first conductivity type, disposed on the semiconductor substrate;

a semiconductor region, whose impurity concentration is higher than that of said first semiconductor body and whose diameter is larger than that of said first semiconductor body, having a second conductivity type opposite to that of said first conductivity type, disposed on said first semiconductor body;

a semiconductor layer, whose impurity concentration is lower than that of said first semiconductor body, disposed between said semiconductor substrate and said semiconductor region, so as to cover a *p-n* junction between said first semiconductor body and said semiconductor region; and electrodes disposed on said semiconductor substrate and said semiconductor region, respectively.

2. A semiconductor device suitable for IMPATT diodes or varactor diodes according to claim 1, wherein said semiconductor substrate has a projection, and said first semiconductor body is disposed on said projection.

3. A semiconductor device suitable for IMPATT diodes or varactor diodes according to claim 1, which further comprises a second semiconductor body having said second conductivity type, and a diameter, the same as that of said first semiconductor body having said first conductivity type, disposed between said semiconductor region and said first semiconductor body of said first conductivity type, thereby forming a *p-n* junction therebetween, and said semiconductor layer is disposed on the surfaces of said first and second semiconductor bodies so as to cover at least a portion of the surface of said first and second semiconductor bodies at which said *p-n* junction is exposed.

4. A semiconductor device suitable for IMPATT diodes or varactor diodes according to claim 3, wherein said semiconductor substrate has a projection, and said first semiconductor body of said first conductivity type is disposed on said projection.

5. A semiconductor device suitable for IMPATT diodes or varactor diodes according to claim 3, wherein said second semiconductor body has the same impurity concentration as that of said first semiconductor body of said first conductivity type.

6. A semiconductor device suitable for IMPATT diodes or varactor diodes according to claim 3, wherein said second semiconductor body has a different impurity concentration with respect to that of said first semiconductor body of said first conductivity type.

7. A semiconductor device suitable for IMPATT diodes or varactor diodes according to claim 3, wherein said second semiconductor body has an impurity concentration higher than that of said first semiconductor body of said first conductivity type.

8. A semiconductor device suitable for IMPATT diodes or varactor diodes according to claim 4, wherein said second semiconductor body has the same impurity concentration as that of said first semiconductor body of said first conductivity type.

9. A semiconductor device suitable for IMPATT diodes or varactor diodes according to claim 4, wherein said second semiconductor body has a different impurity concentration with respect to that of said first semiconductor body of said first conductivity type.

10. A semiconductor device suitable for IMPATT diodes or varactor diodes according to claim 4, wherein said second semiconductor body has an impurity concentration higher than that of said first semiconductor body of said first conductivity type.

* * * * *